(12) United States Patent
Lee et al.

(10) Patent No.: US 7,074,662 B2
(45) Date of Patent: Jul. 11, 2006

(54) METHODS FOR FABRICATING FIN FIELD EFFECT TRANSISTORS USING A PROTECTIVE LAYER TO REDUCE ETCHING DAMAGE

(75) Inventors: Deok-Hyung Lee, Gyeonggi-do (KR); Si-Young Choi, Gyeonggi-do (KR); Byeong-Chan Lee, Gyeonggi-do (KR); Yong-Hoon Son, Gyeonggi-do (KR); In-Soo Jung, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 91 days.

(21) Appl. No.: 10/869,764

(22) Filed: Jun. 16, 2004

(65) Prior Publication Data

US 2005/0019993 A1    Jan. 27, 2005

(30) Foreign Application Priority Data

Jul. 24, 2003    (KR) ...................... 10-2003-0051028

(51) Int. Cl.
*H01L 21/8238*    (2006.01)

(52) U.S. Cl. ...................... 438/199; 438/157; 438/176; 438/197; 438/283; 438/294; 438/296; 438/300; 438/303; 257/E21.442

(58) Field of Classification Search ................ 438/157, 438/176, 283, 179, 294, 296, 199, 300, 303; 257/E21.442

See application file for complete search history.

(56) References Cited

U.S. PATENT DOCUMENTS

| 5,844,278 | A | 12/1998 | Mizuno et al. |
| 6,413,802 | B1 | 7/2002 | Hu et al. |
| 6,548,866 | B1 | 4/2003 | Noguchi |
| 6,764,884 | B1 | 7/2004 | Yu et al. |
| 2002/0011612 | A1 | 1/2002 | Hieda |
| 2005/0118824 | A1* | 6/2005 | Achuthan et al. ........... 438/692 |

* cited by examiner

*Primary Examiner*—George Fourson
*Assistant Examiner*—Thanh V. Pham
(74) *Attorney, Agent, or Firm*—Myers Bigel Sibley & Sajovec, PA

(57) ABSTRACT

A method of forming a fin field effect transistor on a semiconductor substrate includes forming a vertical fin protruding from the substrate. A buffer oxide liner is formed on a top surface and on sidewalls of the fin. A trench is then formed on the substrate, where at least a portion of the fin protrudes from a bottom surface of the trench. The trench may be formed by forming a dummy gate on at least a portion of the fin, forming an insulation layer on the fin surrounding the dummy gate, and then removing the dummy gate to expose the at least a portion of the fin, such that the trench is surrounded by the insulation layer. The buffer oxide liner is then removed from the protruding portion of the fin, and a gate is formed in the trench on the protruding portion of the fin.

43 Claims, 23 Drawing Sheets

METHODS FOR FABRICATING FIN FIELD EFFECT TRANSISTORS USING A PROTECTIVE LAYER TO REDUCE ETCHING DAMAGE

CLAIM OF PRIORITY

This application claims priority from Korean Patent Application No. 10-2003-51028, filed on Jul. 24, 2003, the disclosure of which is hereby incorporated herein by reference.

BACKGROUND OF THE INVENTION

1. Field of the Invention

The present invention relates to semiconductor devices, and, more particularly, to Field-Effect Transistors (FETs) and methods of fabricating the same.

2. Description of the Related Art

As semiconductor devices become highly integrated, problems associated with degradation of transistor characteristics may arise. Examples of these problems may include short channel effects such as punch-through, Drain Induced Barrier Lowering (DIBL), and subthreshold swing, as well as increased parasitic capacitance between the junction region and the substrate (i.e. a junction capacitor) and increased leakage current.

Double-gate field-effect transistors may overcome many of these problems. In a double-gate field-effect transistor, gate electrodes may be formed on both sides of the channel region of the transistor, and as such, may control both sides of the channel. As a result, short channel effects can be suppressed.

A Fin FET is a type of double-gate field-effect transistor. In a Fin FET, a silicon-on-insulator (SOI) substrate or a bulk substrate may be used. For example, a method for fabricating a Fin FET using a SOI substrate is disclosed in U.S. Pat. No. 6,413,802. FIG. 1 to FIG. 5 are cross-sectional views illustrating a method for fabricating a Fin FET according to U.S. Pat. No. 6,413,802.

FIG. 1 and FIG. 2 illustrate a semiconductor substrate 10, a buried oxide layer 12, and a SOI layer 14. Referring to FIG. 1, a hard mask 16 is formed on the SOI layer 14 to protect an upper portion thereof. Next, referring to FIG. 2, an etching mask pattern 18 for defining a silicon fin is formed on the hard mask 16.

Referring to FIG. 3, portions of the hard mask 16 and SOI layer 14 exposed by the etching mask pattern 18 are etched to form a silicon fin 14a. Referring to FIG. 4, after depositing a gate electrode material on the substrate 10, an etching mask 22 is formed on the gate electrode material. The gate electrode material left exposed by the etching mask 22 is then etched to form a transistor gate 20. Referring to FIG. 5, insulation layer spacers 24 are formed on both sidewalls of the gate 20.

A method for fabricating a Fin FET using a bulk substrate is disclosed in U.S. Pat. No. 5,844,278 and published U.S. Patent Application Publication No.2002/0011612. According to these methods, the bulk silicon substrate is etched to form a silicon fin. An insulation material is then formed to electrically isolate the silicon fin. Next, gate electrode material is deposited on the substrate over the fin. The gate electrode material is then etched to form a gate.

As compared to that of a conventional planar transistor (where a gate electrode is formed on a planar surface), the fabrication process for a Fin FET using a SOI substrate or a bulk substrate may form an "electrical bridge" between neighboring gate electrodes when the gates are formed on the substrate and the silicon fin projecting therefrom. In other words, neighboring gates may be electrically connected.

Accordingly, over-etching may be performed to prevent such an electrical bridge from being formed between neighboring gate electrodes. However, the sidewalls of silicon fins (i.e. the channel region) may be damaged by the etching process. For example, the thickness of the gate oxide layer may become thin at the edge of the gate due to over-etching, such that gate induced diode leakage (GIDL) may occur. Junction leakage current may be increased as well.

SUMMARY OF THE INVENTION

According to various embodiments of the present invention, a method of forming a fin field effect transistor on a semiconductor substrate includes forming a vertical fin protruding from the substrate. A buffer oxide liner is formed on a top surface and on sidewalls of the fin. A trench is then formed on the substrate. At least a portion of the fin protrudes from a bottom surface of the trench. The buffer oxide liner is removed from the protruding portion of the fin, and a gate is formed in the trench on the protruding portion of the fin.

In some embodiments, a method of forming a fin field effect transistor on a semiconductor substrate includes forming a vertical fin protruding from the substrate. A buffer oxide liner is formed on a top surface and on sidewalls of the fin, and a dummy gate is formed on at least a portion of the fin. An insulation layer is formed on the fin surrounding the dummy gate, and the dummy gate is then removed to expose the at least a portion of the fin and to form a trench surrounded by the insulation layer. The buffer oxide liner is removed from the exposed portion of the fin, and a gate is formed in the trench.

In other embodiments, a fin-capping layer may be formed on the top surface of the fin before forming the buffer oxide liner. The fin-capping layer may include a nitride layer and an oxide layer.

In some embodiments, a device isolation layer may be formed prior to forming the buffer oxide liner. The device isolation layer includes a nitride liner formed on the substrate and on the top surface and on the sidewalls of the fin, and an upper trench insulation layer formed on the substrate. At least a portion of the fin protrudes above the upper trench insulation layer. The nitride liner is then removed from the at least a portion of the fin. The device isolation layer may further include a lower trench insulation layer formed on the substrate before forming the nitride liner. The upper trench insulation layer may be removed after removing the nitride liner from the at least a portion of the fin. An oxide liner may also be formed on the fin before forming the nitride liner. The oxide liner may then be removed from the at least a portion of the fin after removing the nitride liner.

In other embodiments, the insulation layer may be formed by removing the buffer oxide liner and the fin-capping layer from portions of the fin which are not covered by the dummy gate to expose other portions of the fin. The insulation layer may then be formed surrounding the dummy gates on the exposed other portions of the fin. Also, silicon may be epitaxially grown on the exposed portions of the fin before forming the insulation layer.

In some embodiments, the dummy gate may be formed by forming a sacrificial layer on the substrate and then selectively etching the sacrificial layer with respect to the buffer oxide liner and the fin capping layer to form the dummy gate.

In other embodiments, the dummy gate may be formed by forming a sacrificial layer on the substrate and then selectively etching the sacrificial layer and the buffer oxide liner with respect to the fin capping layer to form the dummy gate.

In some embodiments, the dummy gate may be formed by oxidizing a portion of the dummy gate and then removing the oxidized portion of the dummy gate to reduce a width of the dummy gate.

In other embodiments, spacers may be formed on sidewalls of the dummy gate before forming the insulation layer.

In some embodiments, a gate capping layer may be formed on the gate.

In other embodiments, source and drain regions may be formed in opposite ends of the fin before forming the insulation layer. Channel ion implantation may then be performed in the exposed portion of the fin before forming the gate.

In still other embodiments, source and drain regions may be formed in opposite ends of the fin after removing the buffer oxide liner and before forming the insulation layer. Channel ion implantation may then be performed in the exposed portion of the fin after removing the buffer oxide liner and before forming the gate.

BRIEF DESCRIPTION OF THE DRAWINGS

FIG. 6A to FIG. 17A are perspective views illustrating methods of fabricating Fin FETs according to various embodiments of the present invention.

FIG. 6B to FIG. 17B are cross-sectional views illustrating methods of fabricating Fin FETs according to various embodiments of the present invention taken along line I–I' in FIG. 6A.

FIG. 6C to FIG. 17C are cross-sectional views illustrating methods of fabricating Fin FETs according to various embodiments of the present invention taken along line II–II' in FIG. 6A.

FIG. 12D to FIG. 17D are cross-sectional views illustrating methods of fabricating Fin FETs according to various embodiments of the present invention taken along line III–III' in FIG. 12A.

DETAILED DESCRIPTION OF THE INVENTION

Figure 1:
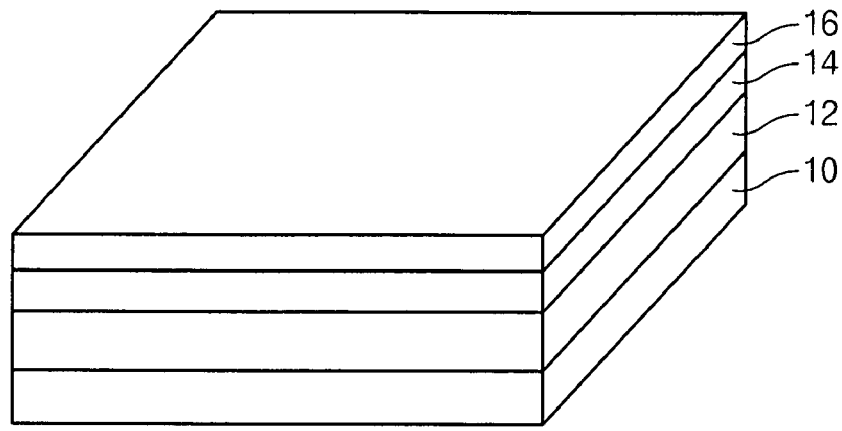
FIG. 1 to FIG. 5 are cross-sectional views of a semiconductor substrate illustrating conventional methods for fabricating a Fin FET on a SOI substrate.
Figure 2:
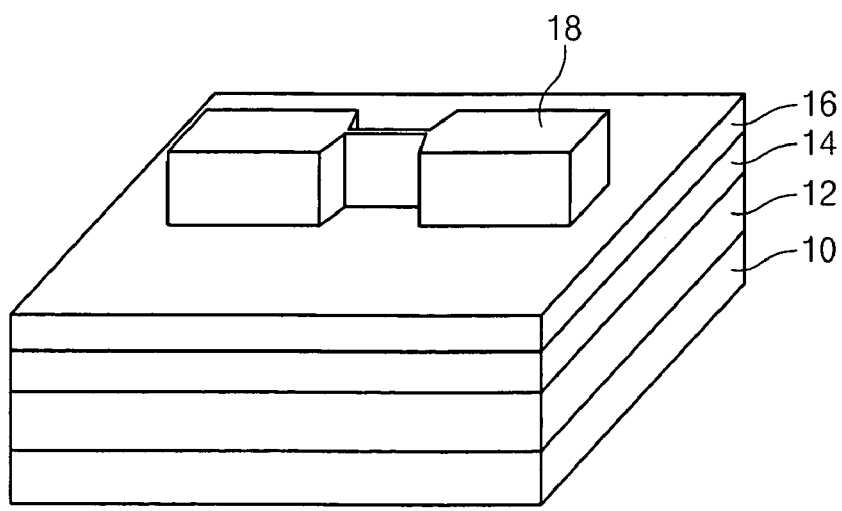
Figure 3:
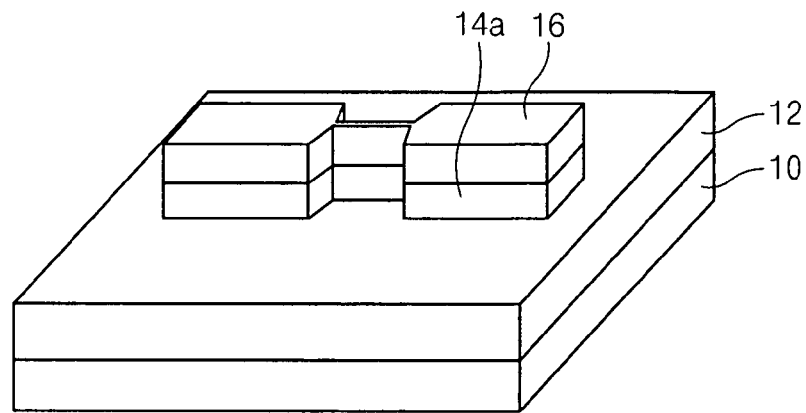
Figure 4:
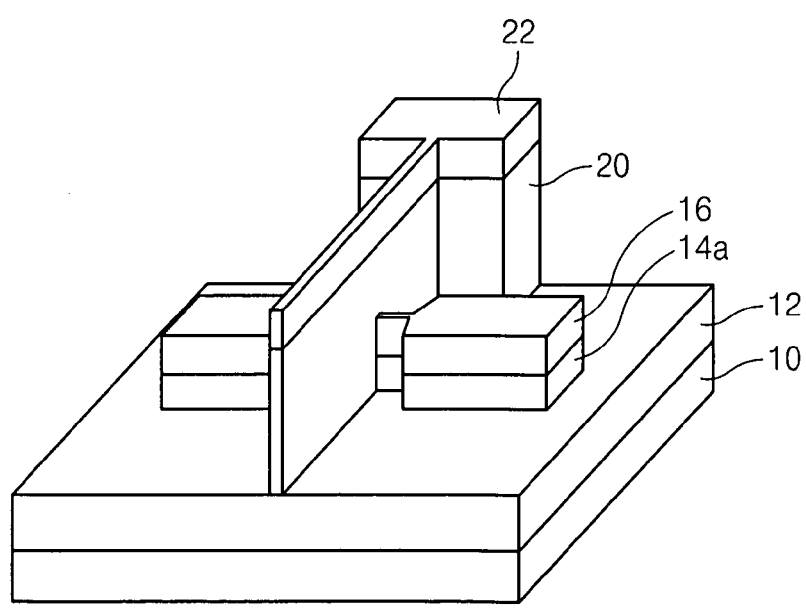
Figure 5:
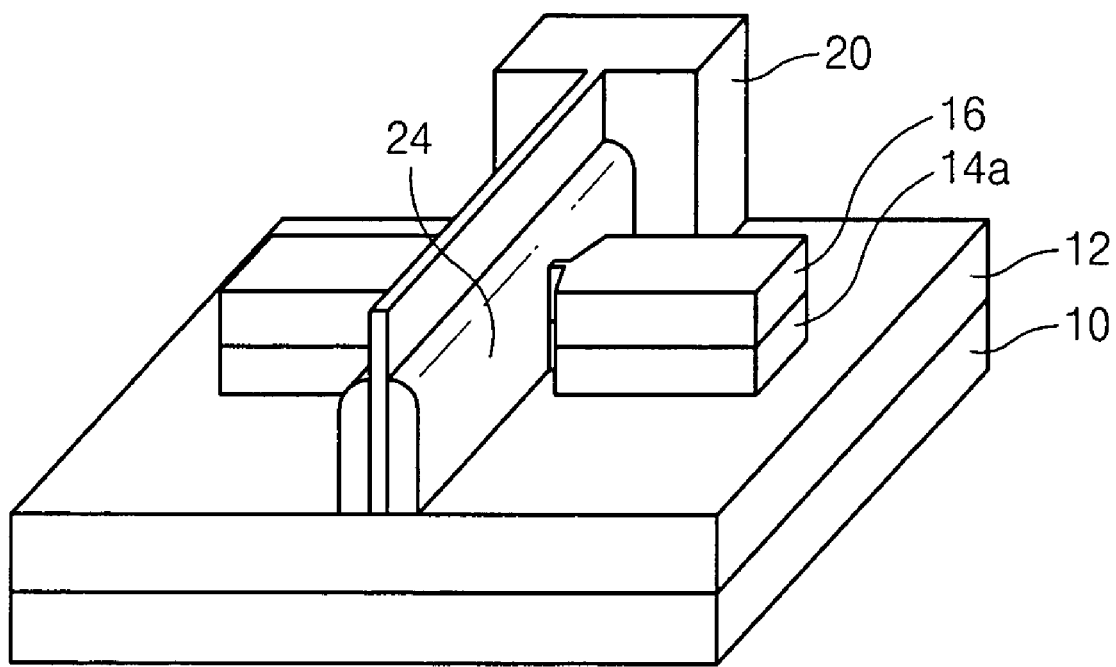

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. It will be understood that when an element such as a layer, region or substrate is referred to as being "on" another element, it can be directly on the other element or intervening elements may also be present. It will be understood that when an element such as a layer, region or substrate is referred to as "under" another element, it can be directly under the other element or intervening elements may also be present. It will also be understood that the term "and/or" as used herein refers to and encompasses any and all possible combinations of one or more of the associated listed items.

Furthermore, relative terms such as beneath may be used herein to describe one layer or region's relationship to another layer or region as illustrated in the Figures. It will be understood that these terms are intended to encompass different orientations of the device in addition to the orientation depicted in the Figures. For example, if the device in the Figures is turned over, layers or regions described as "beneath" other layers or regions would now be oriented "above" these other layers or regions. The term "beneath" is intended to encompass both above and beneath in this situation. Like numbers refer to like elements throughout.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. All publications, patent applications, patents, and other references mentioned herein are incorporated by reference in their entirety.

FIG. 6A to FIG. 17A are perspective views illustrating methods of fabricating Fin FETs according to various embodiments of the present invention. FIG. 6B to FIG. 17B are cross-sectional views of the semiconductor substrate taken along line I–I' in FIG. 6A. FIG. 6C to FIG. 17C are cross-sectional views of the semiconductor substrate taken along line II–II' in FIG. 6A. FIG. 12D to FIG. 17D are cross-sectional views of the semiconductor substrate taken along line III–III' in FIG. 12A.

Figure 6A:
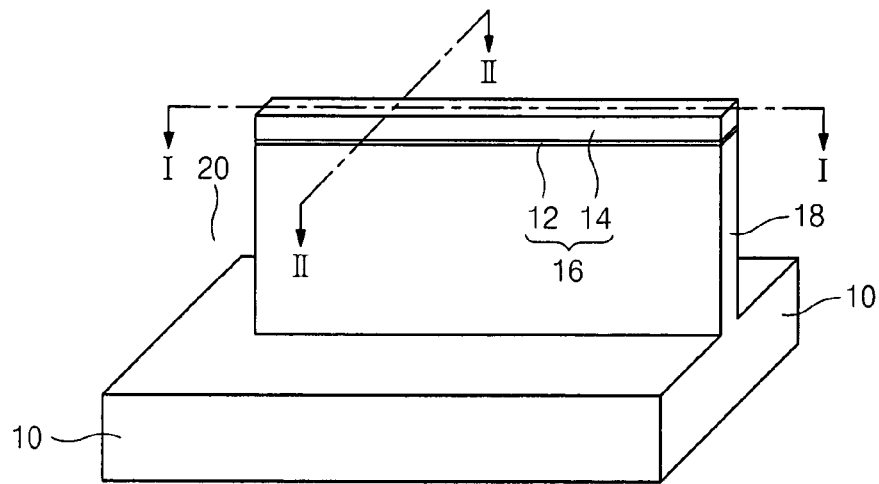
Figure 6B:
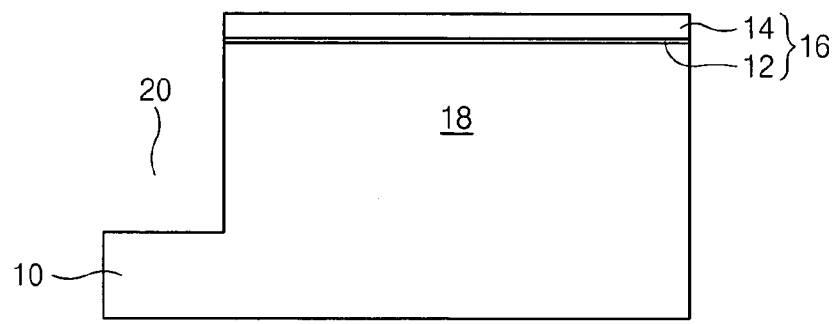
Figure 6C:
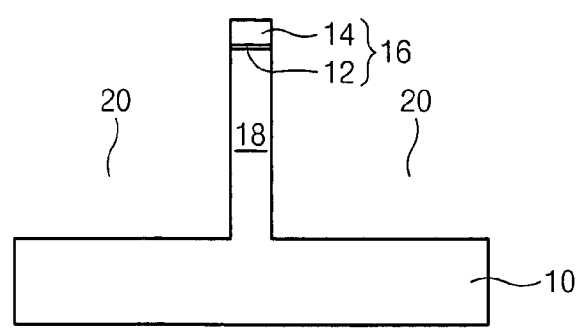

Referring to FIG. 6A to FIG. 6C, a fin capping layer 16 is formed on a substrate 10. For example, the fin capping layer 16 may include an oxide layer 12 and a nitride layer 14, which are sequentially stacked on the substrate 10. The oxide layer 12 may be formed by thermal oxidation, and the nitride layer 14 may be formed by chemical vapor deposition (CVD). The fin capping layer 16 may also be formed by thin film deposition. The exposed substrate 10 is then etched to a predetermined depth, using the fin capping layer 16 as an etching mask, to form a silicon fin 18 protruding from the substrate 10. A trench 20 is also defined between silicon fins 18. That is, the trench 20 may be a region where a part of the substrate 10 has been removed by the etching process. The shape and height of the silicon fin 18 (which may be determined by the depth of the trench 20) may be formed to particular dimensions based on the desired characteristics of the device to be fabricated. In the embodiments of FIG. 6A to FIG. 6C, the silicon fin 18 is formed in the shape of a rectangular bar.

Figure 7A:
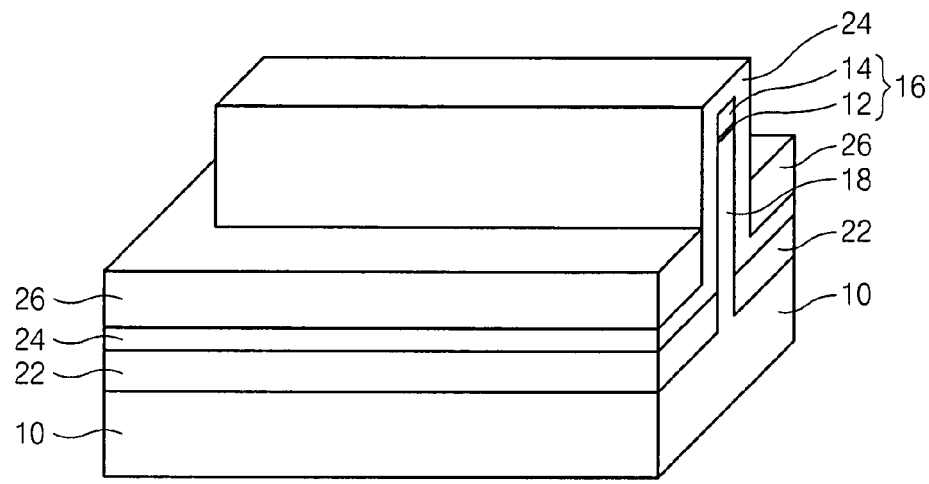
Figure 7B:
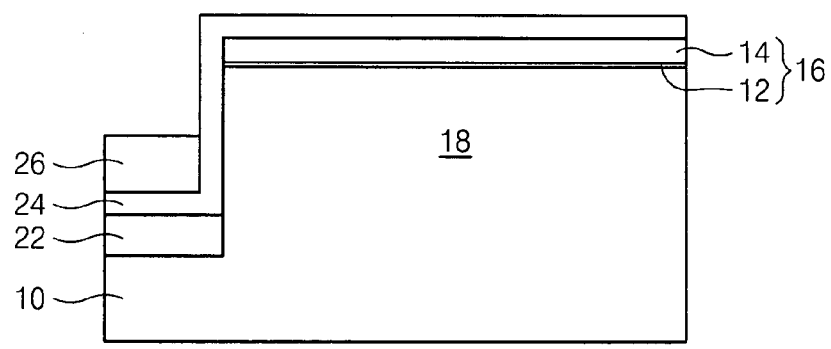
Figure 7C:
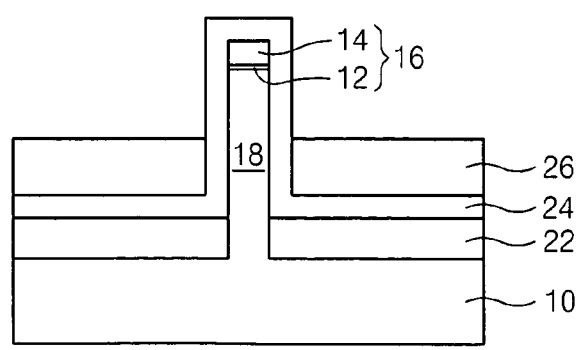

Referring to FIG. 7A to FIG. 7C, an optional lower trench insulation layer 22 is formed, which fills a part of the trench 20. More particularly, an insulation material is formed on the substrate 10 including the fin capping layer 16 to fill the trench 20, and then a planarizing process is performed until the fin capping layer 16 (specifically, the nitride layer 14 of the fin capping layer 16) is exposed. For example, chemical mechanical polishing (CMP) or etch-back may be used as a planarizing process. By performing etch-back or wet etching, a part of the residual insulation material in the trench may be removed to expose part of the sidewalls of the silicon fin 18, thereby forming the optional lower trench insulation layer 22 which partially fills the trench 20. The optional lower trench insulation layer 22 may be formed of an oxide layer, which may be a series of SOG (Spin-On-Glass) layers such as USG (Undoped-Silicon-Glass) and TOSZ. Alternatively, the lower trench insulation layer 22 may be formed of a HDP (High-Density-Plasma) oxide layer.

Before forming the optional lower trench insulation layer 22, a thermal oxidation layer may be formed at the bottom and on inner walls (corresponding to both sidewalls of the silicon fin) of the trench by a thermal oxidation process. An oxidation prevention layer, such as a nitride layer, may also be formed. The thermal oxidation layer may cure defects in the substrate which may result from the etching process.

Referring again to FIG. 7A to FIG. 7C, a nitride liner 24 is formed along the sidewalls of the exposed silicon fin 18 and on top of the optional lower insulation layer 22 and the fin capping layer 16. Before forming the nitride liner 24, an oxide liner (not shown) may be formed. When the nitride liner 24 is removed in a subsequent process, the oxide liner may serve to protect the fin capping layer 16. The nitride liner 24 may be formed by CVD to a thickness of about 100 to about 400 Angstroms. An upper trench insulation layer 26 is then formed on the nitride liner 24 to fill a part of the trench 20. The upper trench insulation layer 26 may be formed of a HDP oxide layer or an oxide layer of SOG. To form the upper trench insulation layer 26, an insulation material is deposited on the nitride liner 24 to fill the trench 20. A planarizing process is then performed until the nitride liner 24 is exposed. As a result, the excess insulation material outside of the trench 20 is removed. The height of the upper trench insulation layer 26 is then lowered below that of the silicon fin 18 by removing a portion of the insulation material in the trench 20 through an etch-back process. In this case, the channel width of the transistor (defined by the height of the silicon fin 18) may depend on the amount of the upper trench insulation layer 26 that is removed. This amount may be controlled based on the desired characteristics of the device to be fabricated.

Figure 8A:
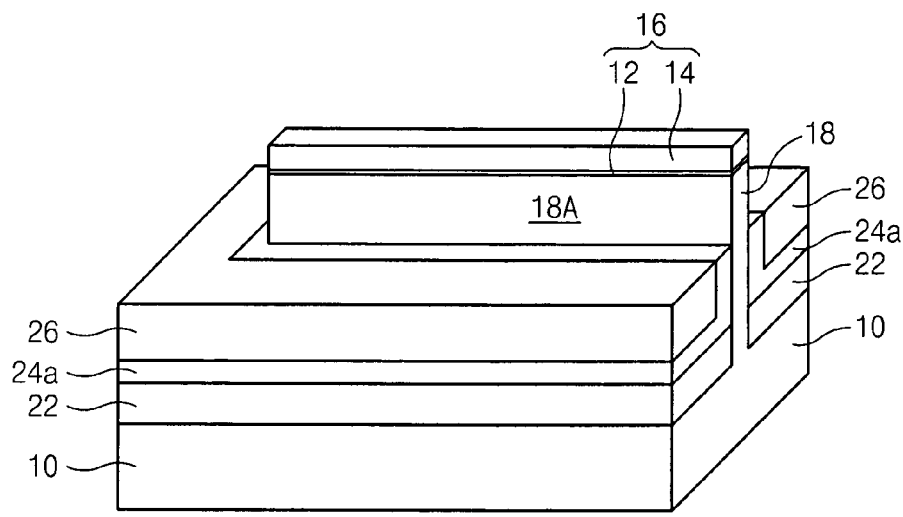
Figure 8B:
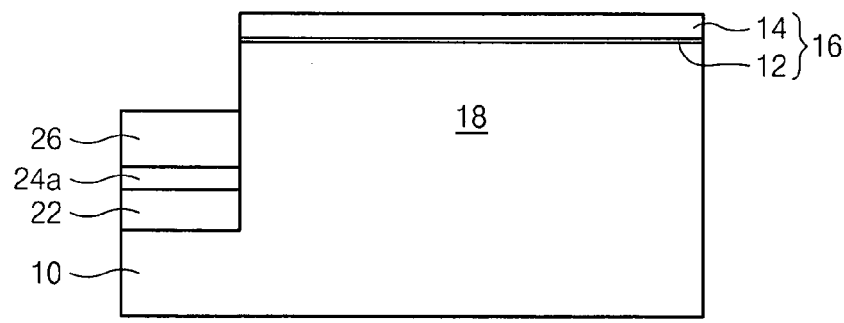
Figure 8C:
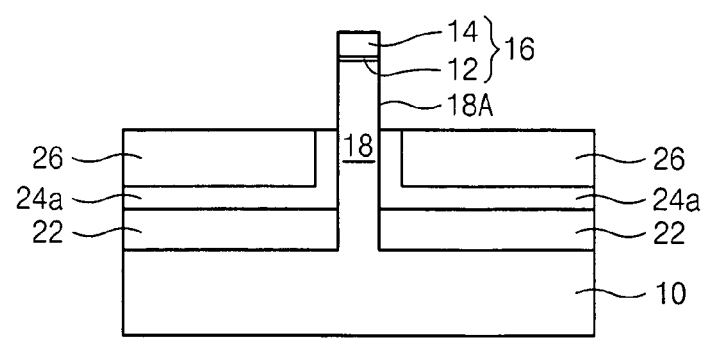

Next, referring to FIG. 8A to FIG. 8C, the exposed portion of the nitride liner (i.e., the nitride liner 24 except for the portion that is covered by the upper trench insulation layer 26) is removed to form a residual nitride liner 24a, exposing a part of the sidewalls 18A of the silicon fin 18. The exposed portion of the nitride liner 24 may be removed by dry etching or by wet etching using phosphoric acid. After removing this portion of the nitride liner 24, the upper trench insulation layer 26 may be removed by a selective etching process. For example, the upper insulation layer 26 may be removed by dry etching or by wet etching using fluoric acid.

When the exposed portion of the nitride liner 24 is removed, the amount of etching may be controlled so as to avoid removing the nitride layer 14 of the fin capping layer 16. As previously mentioned, if an oxide layer is formed on the fin 18, the oxide layer may protect the nitride layer 14 of the fin capping layer 16. In this case, after removing the portion of the nitride liner 24, the exposed oxide layer may also be removed to expose a part of the sidewalls 18A of the silicon fin 18.

Figure 9A:
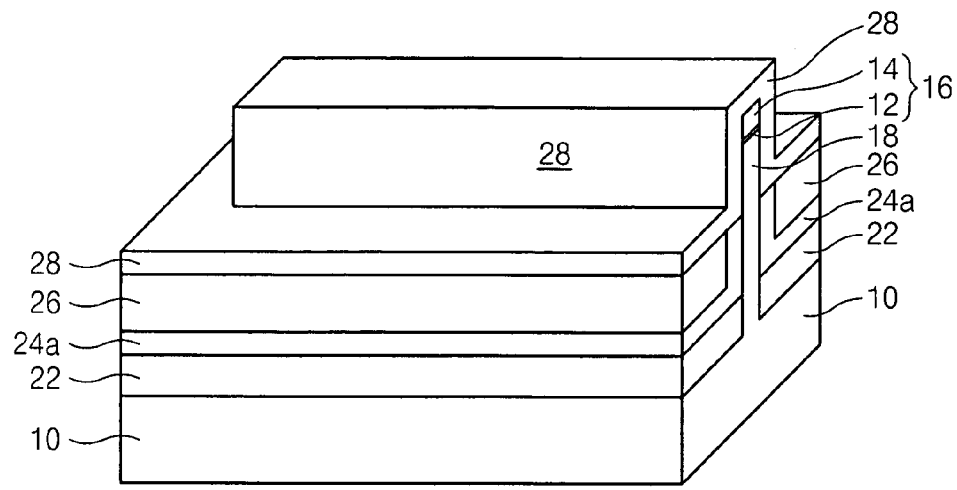
Figure 9B:
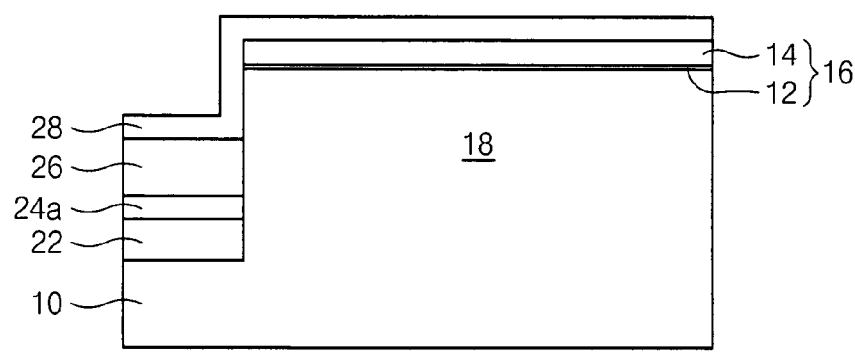
Figure 9C:
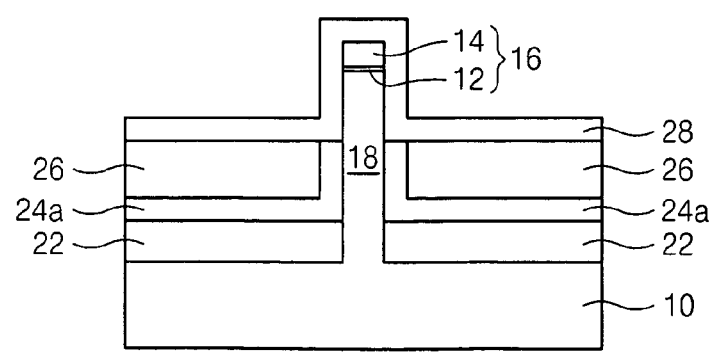

Next, referring to FIG. 9A to FIG. 9C, a buffer oxide liner 28 is formed. The buffer oxide liner 28 covers the residual nitride liner 24a, the upper trench insulation layer 26, a part of sidewalls 18A of the silicon fin 18, and the fin capping layer 16. The buffer oxide liner 28 may be formed to a thickness of about 100 to about 300 Angstroms using a conventional thin-film deposition method, such as CVD. The buffer oxide liner 28 may protect the sidewalls of the silicon fin 18 in subsequent processing.

Figure 10A:
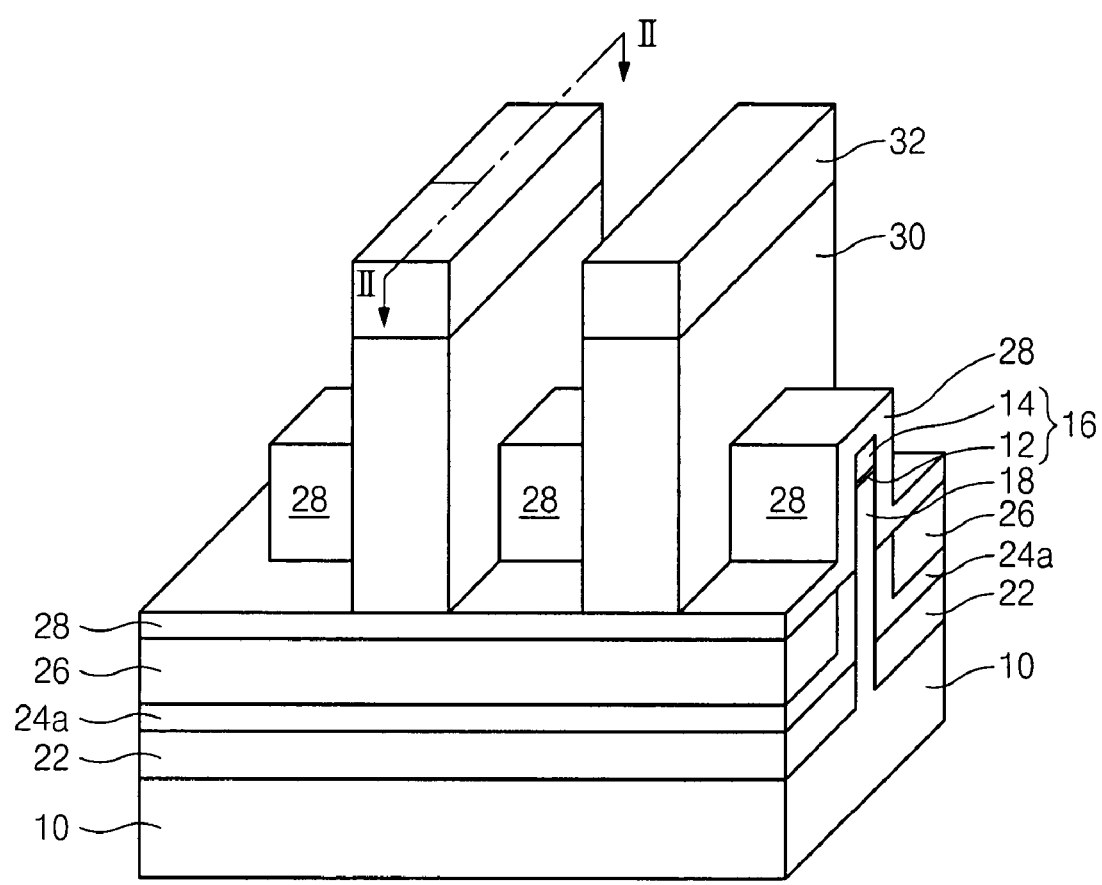
Figure 10B:
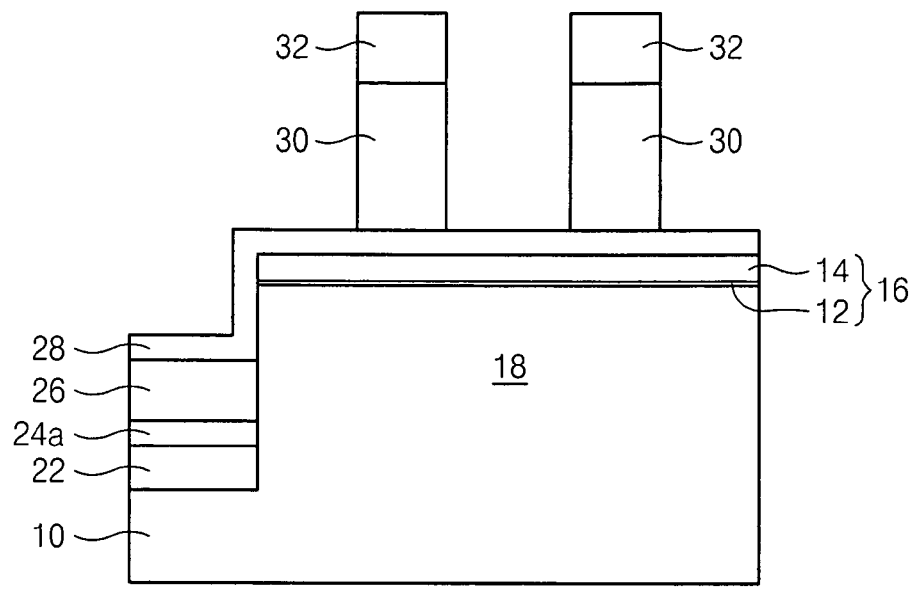
Figure 10C:
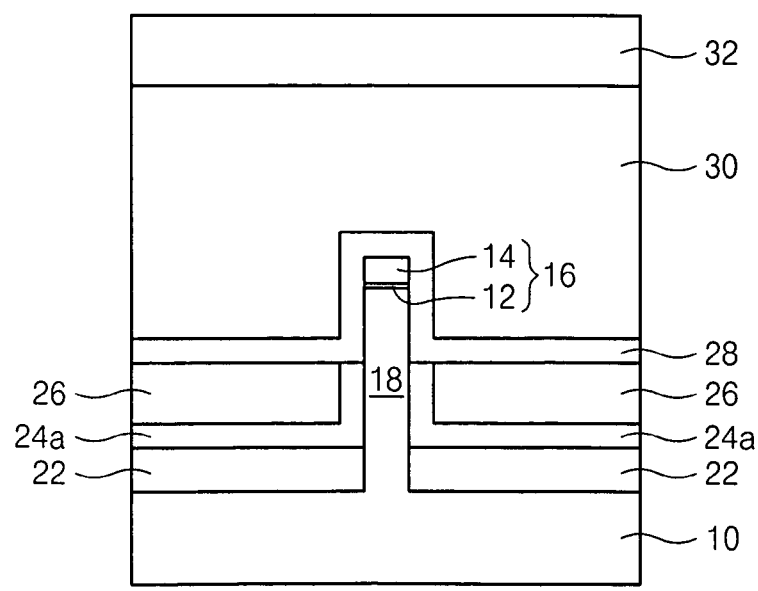

Next, referring to FIG. 10A to FIG. 10C, a sacrificial layer is formed which may fill the trench 20 and which may have a predetermined height (corresponding to the desired height of the transistor gate) from the fin capping layer. The sacrificial layer may be formed to the desired height of a gate electrode. An etching mask 32 is then formed on the sacrificial layer. The portion of the sacrificial layer exposed by the etching mask 32 is etched to form a dummy gate 30. The dummy gate 30 may be formed of silicon. The etching mask 32 may be formed of a nitride layer.

Figure 11A:
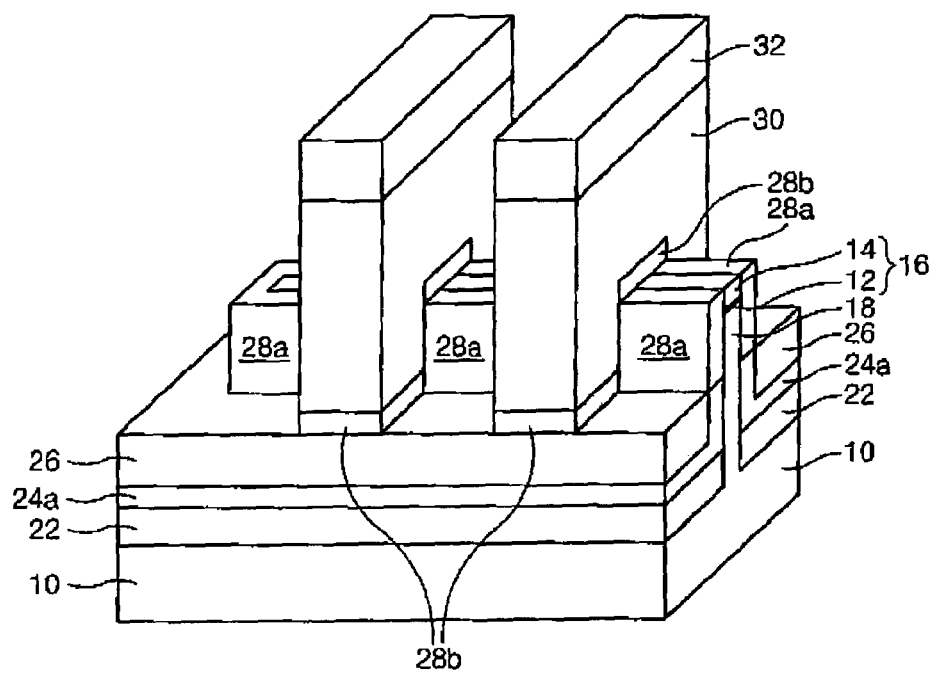
Figure 11B:
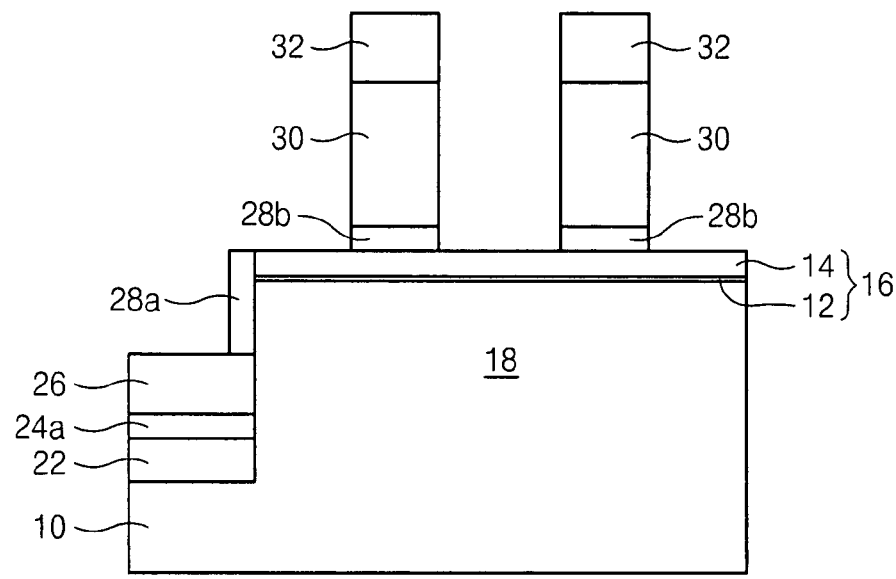
Figure 11C:
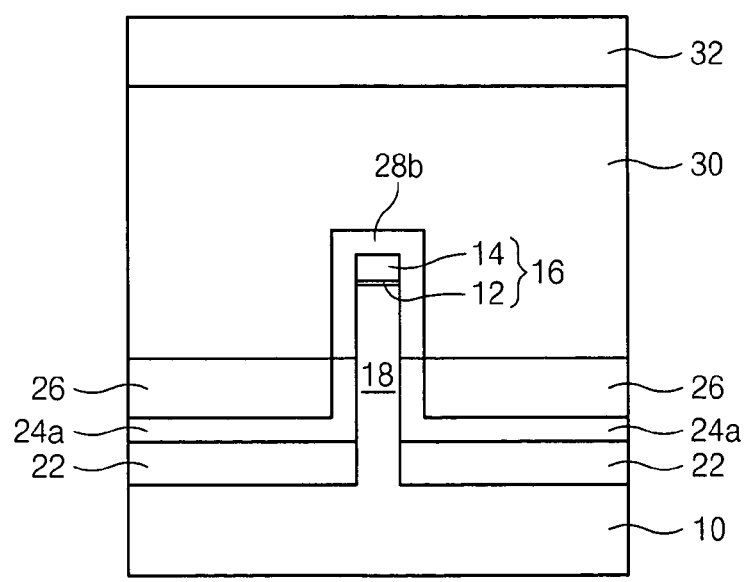
Figure 12A:
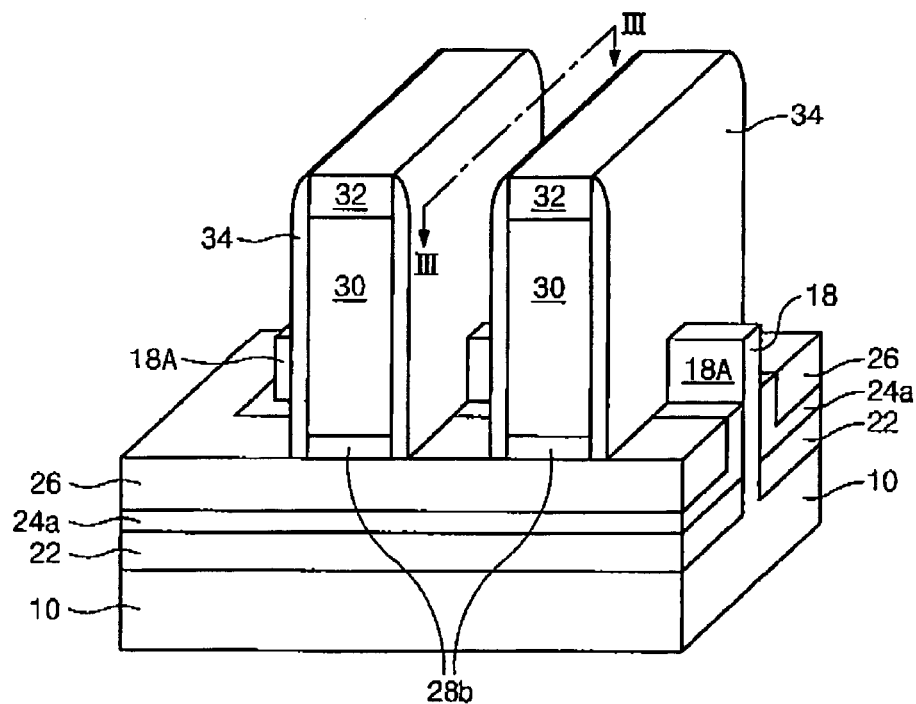
Figure 12B:
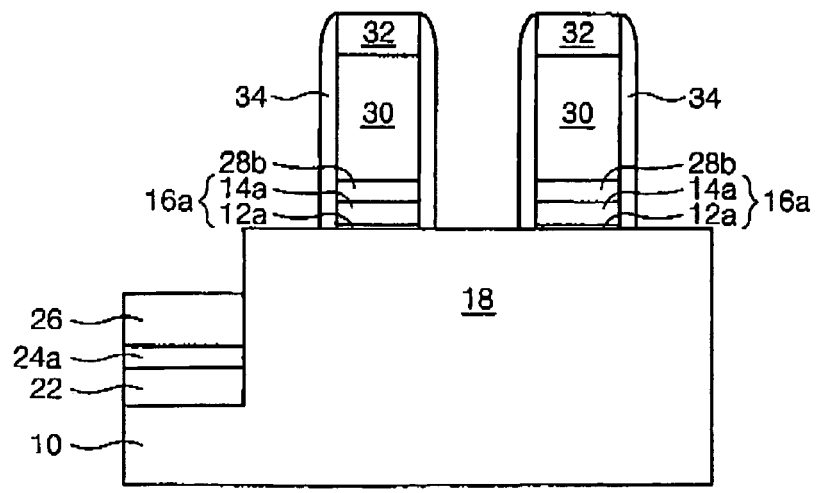
Figure 12C:
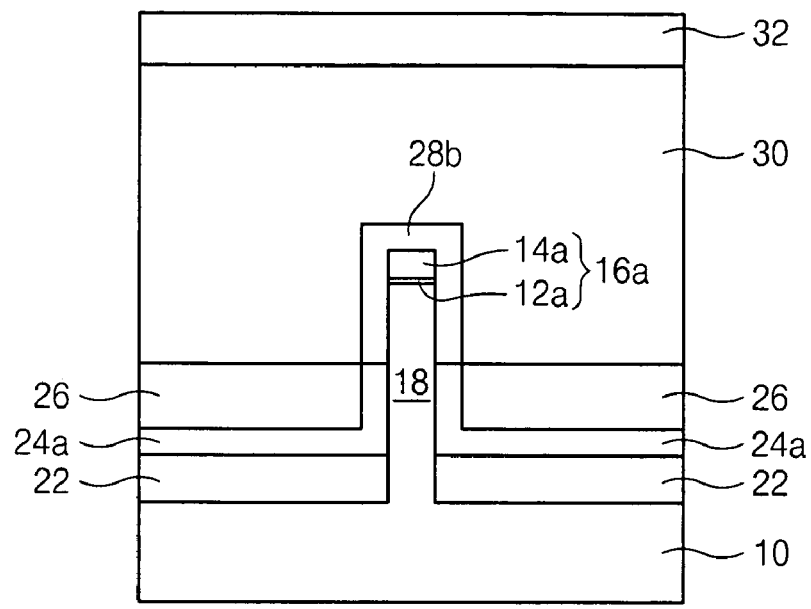
Figure 12D:
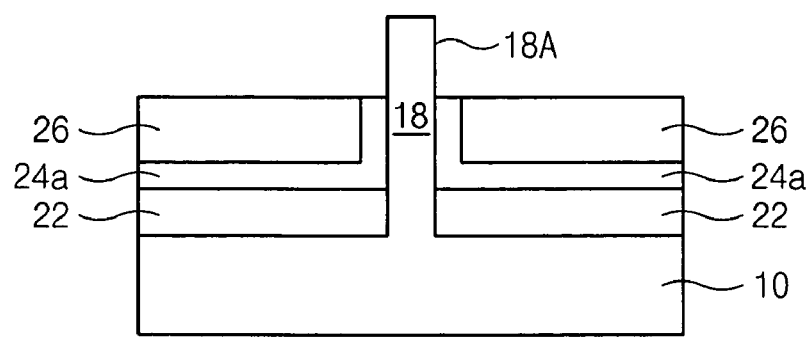
Figure 13A:
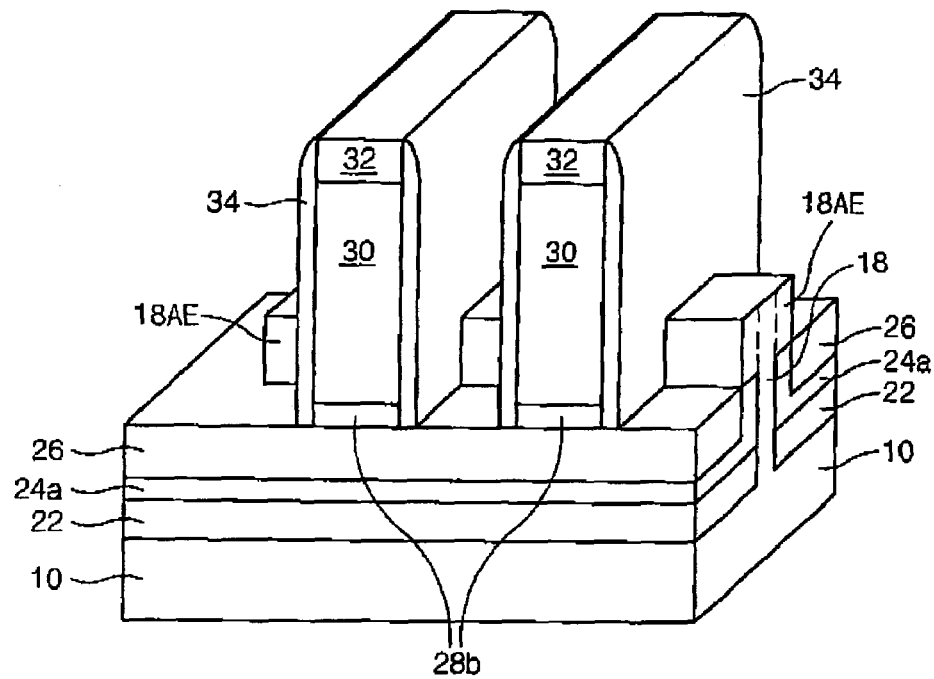
Figure 13B:
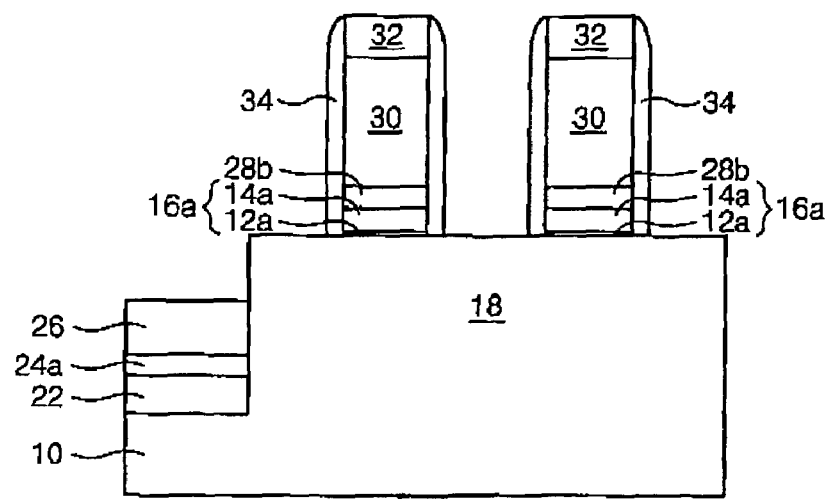
Figure 13C:
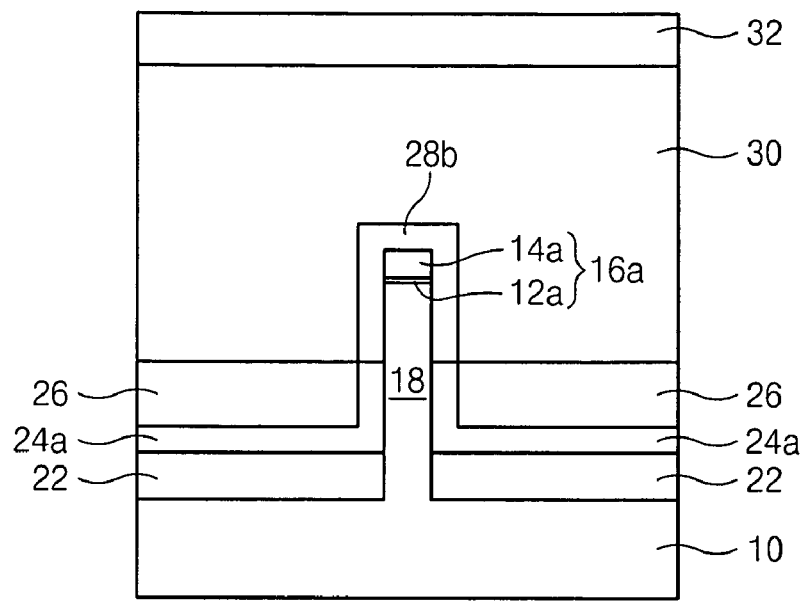
Figure 13D:
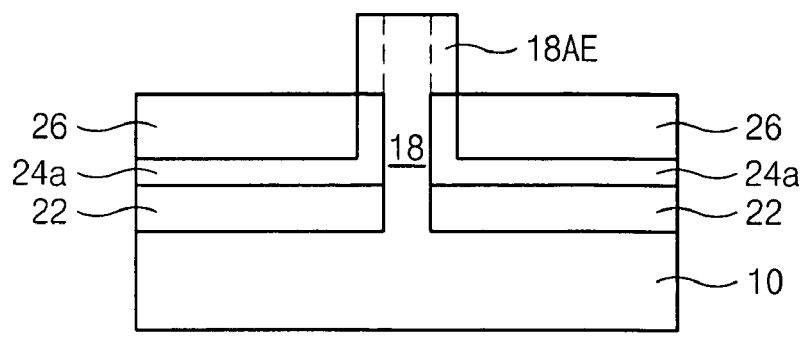
Figure 14A:
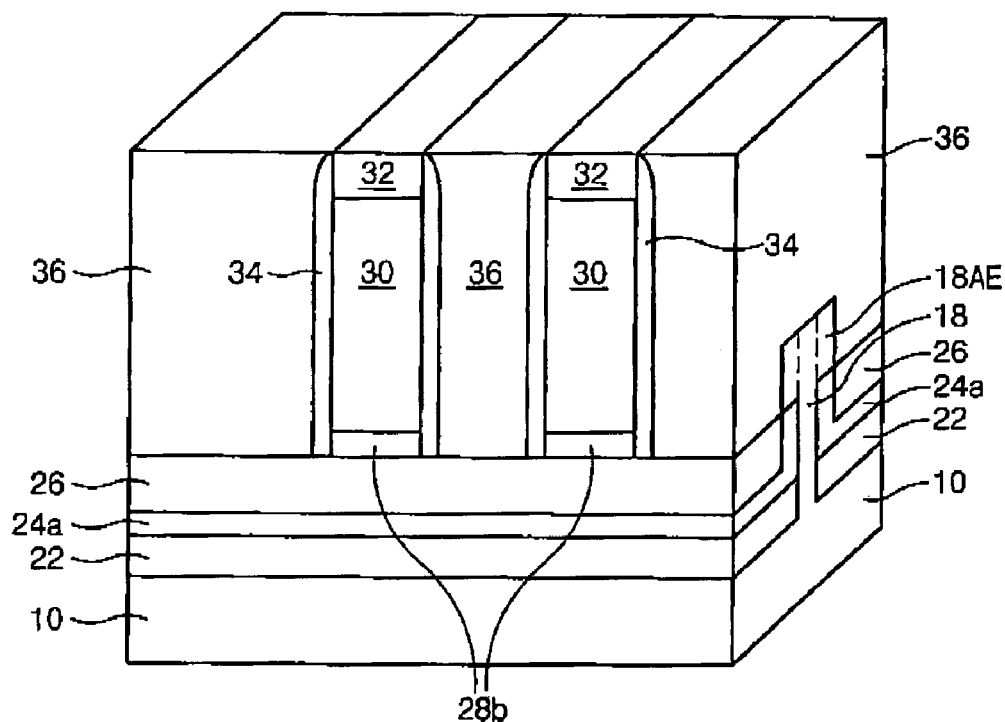
Figure 14B:
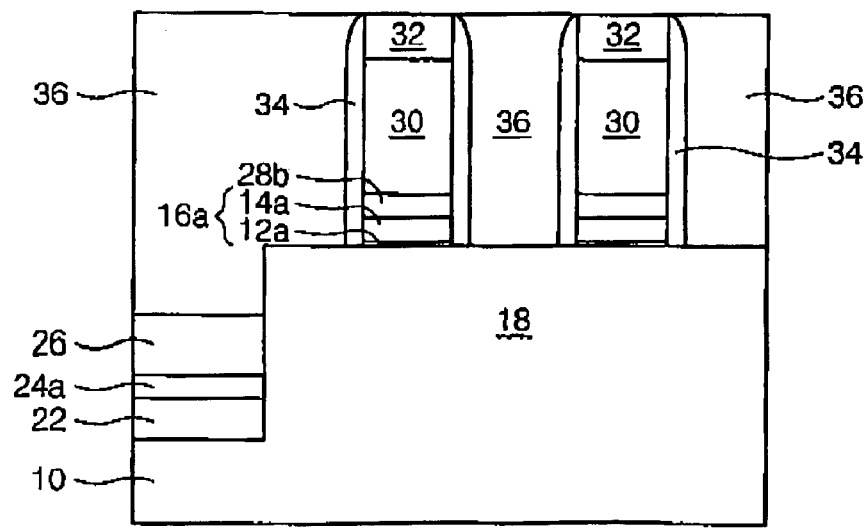
Figure 14C:
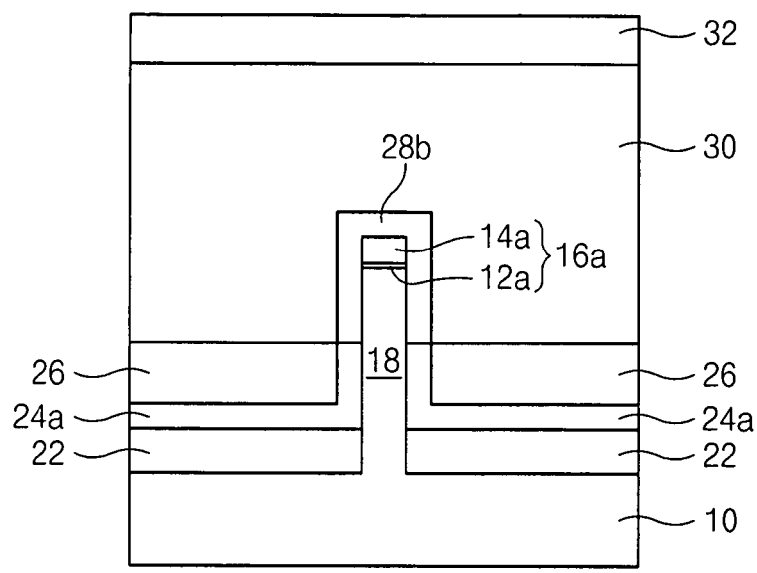
Figure 14D:
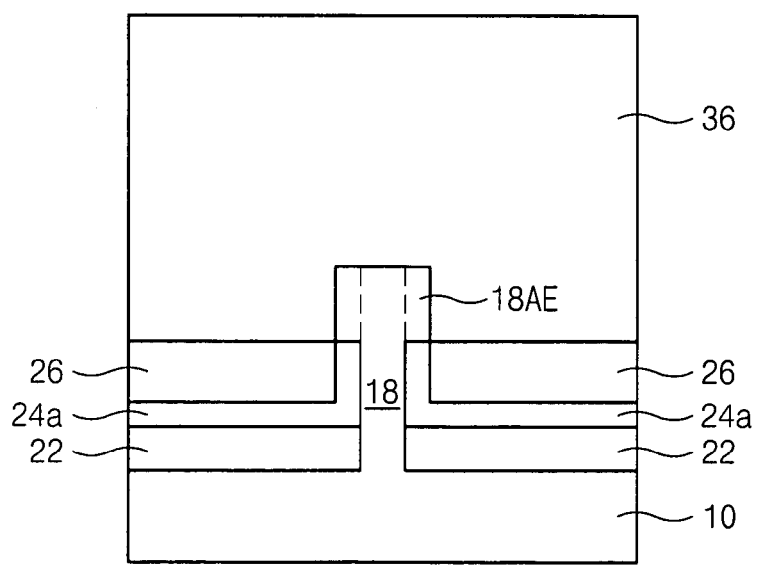
Figure 15A:
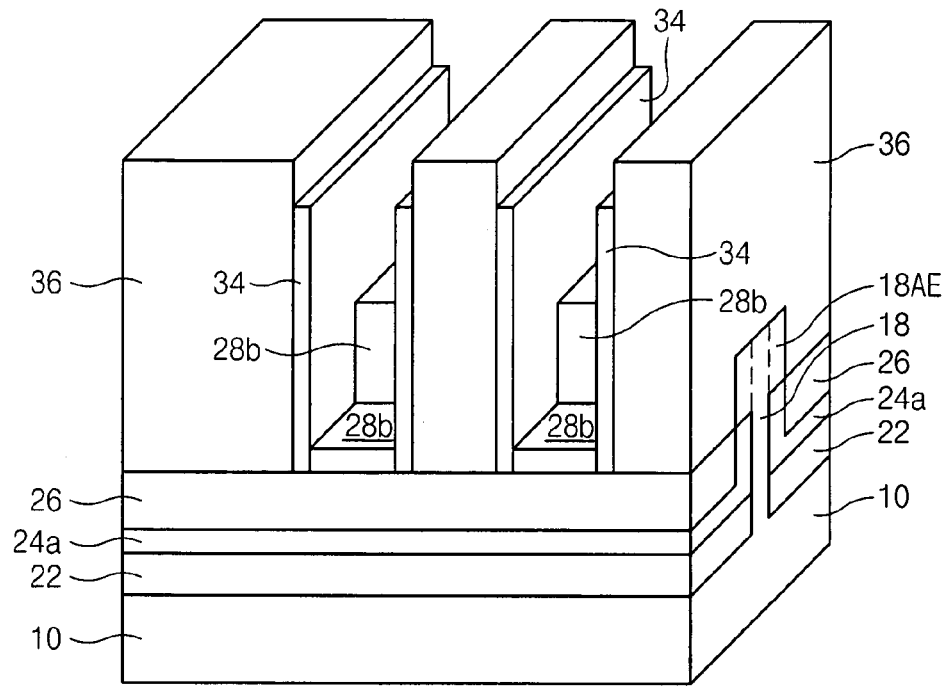
Figure 15B:
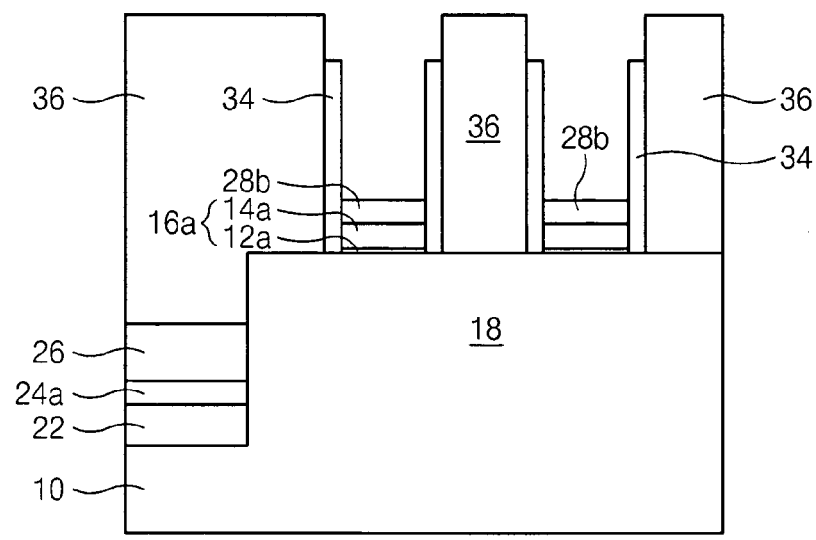
Figure 15C:
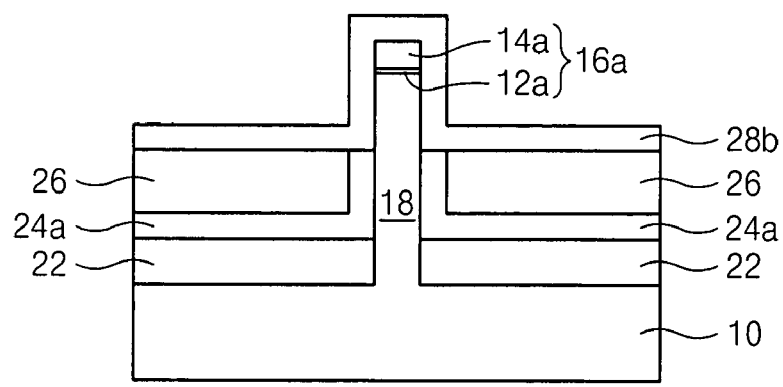
Figure 15D:
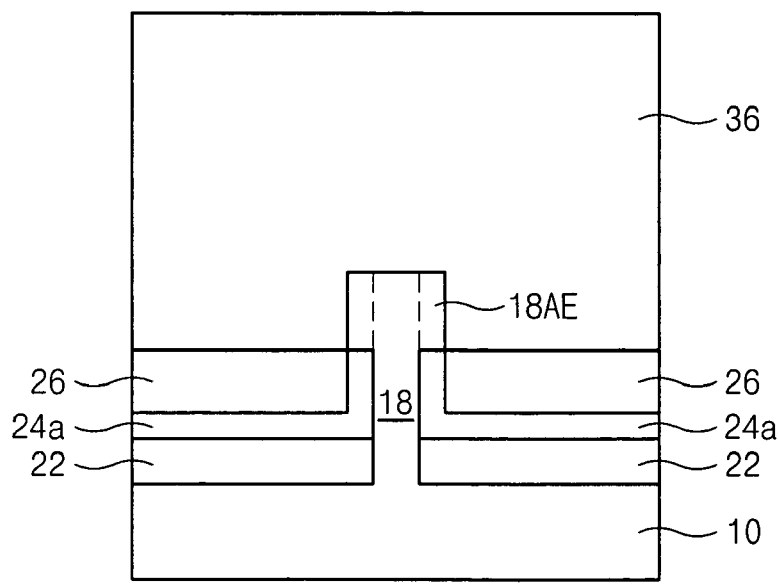
Figure 16A:
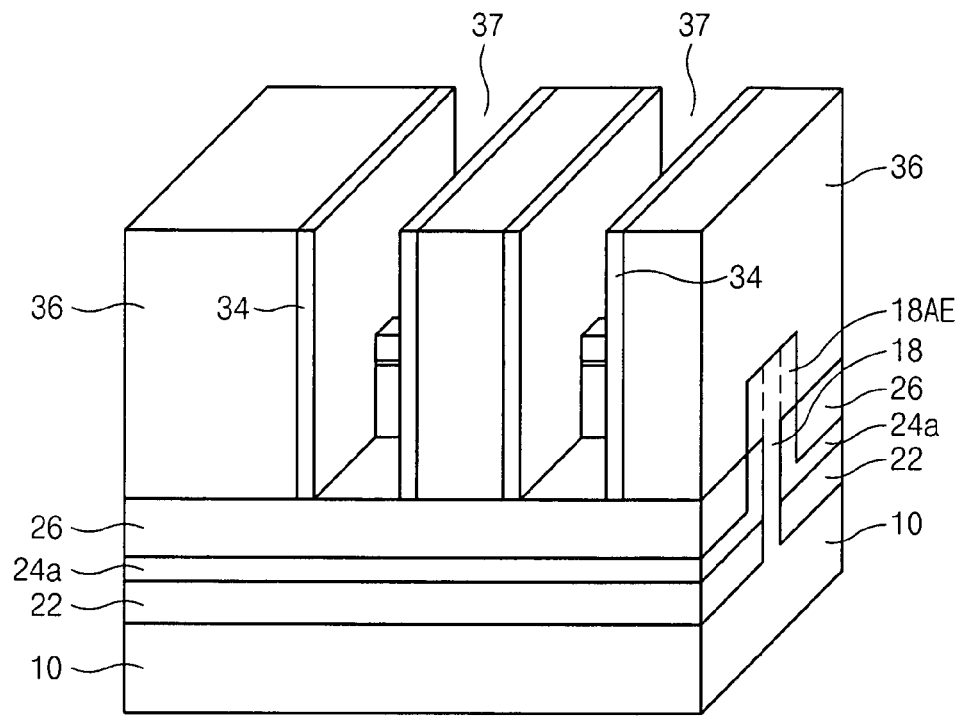
Figure 16B:
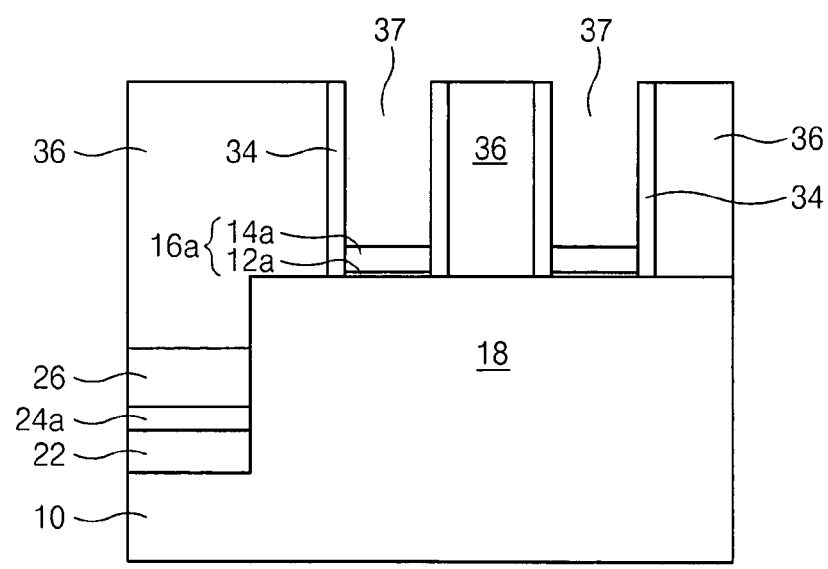
Figure 16C:
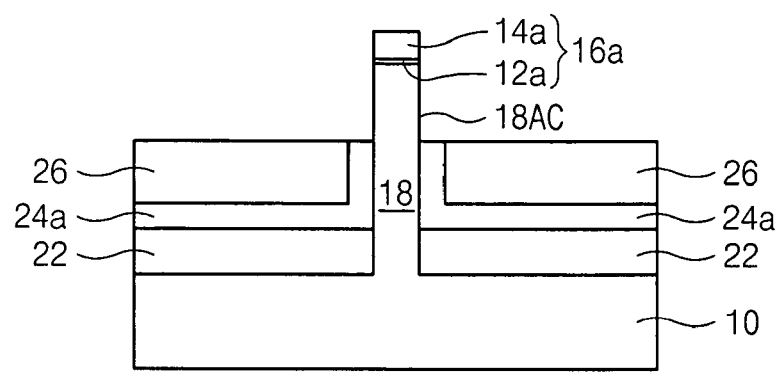
Figure 16D:
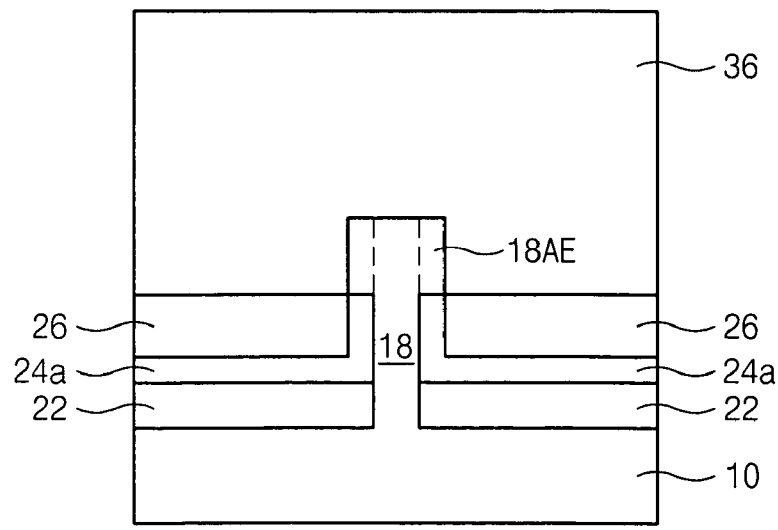
Figure 17A:
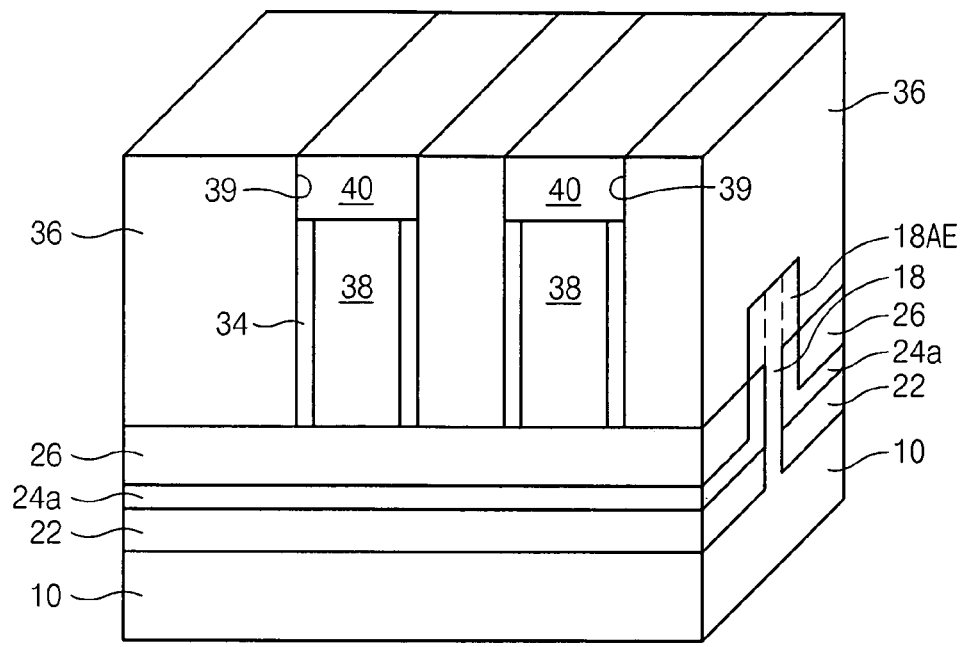
Figure 17B:
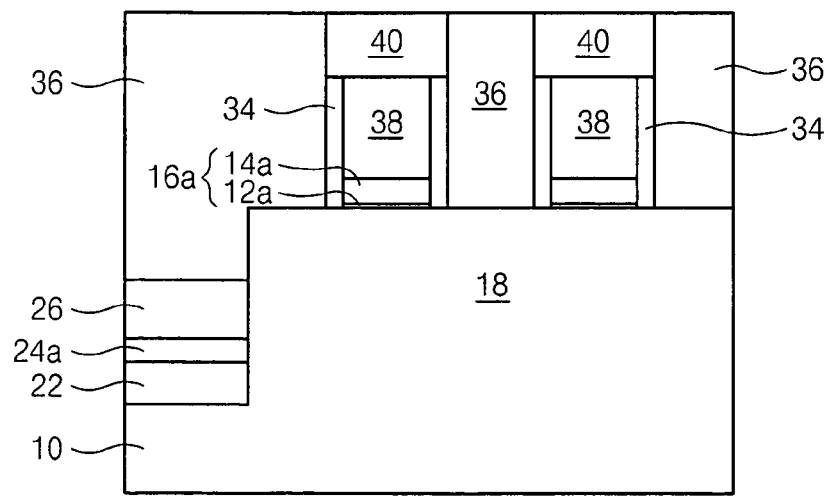
Figure 17C:
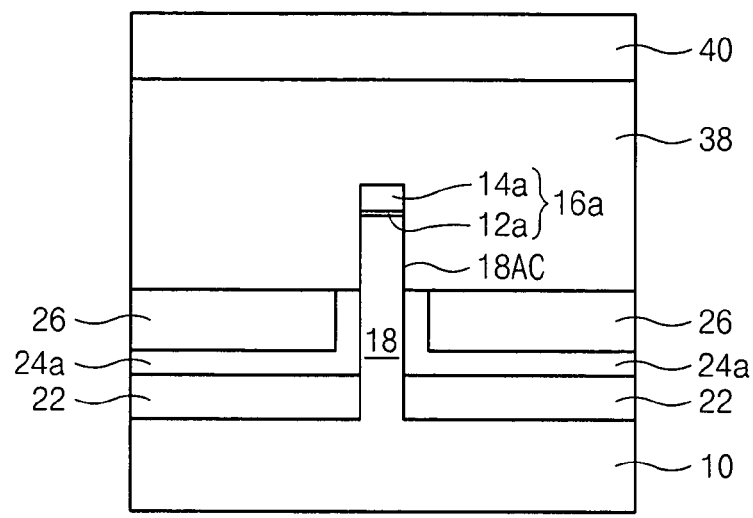
Figure 17D:
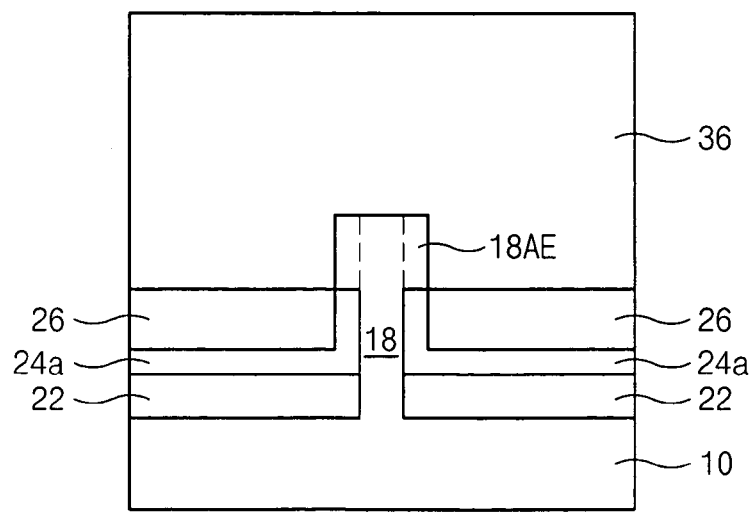

Then, as shown in FIG. 11A to FIG. 11C, the exposed portions of the buffer oxide liner 28 are etched until the fin capping layer 16 (including nitride layer 14) is exposed.

In some embodiments, the sacrificial layer and the buffer oxide liner 28 may be etched by a one-step etching process, using an etch gas which may have an etching selectivity with respect to the nitride layer 14. In other words, to prevent electrical contact between neighboring dummy gates 30, the sacrificial layer and the buffer oxide liner 28 may be over-etched until the fin capping layer 16 is exposed.

Alternatively, after the sacrificial layer is selectively etched with respect to the buffer oxide liner 28 and the nitride layer 14 (of the fin capping layer 16), the buffer oxide liner 28 may be selectively etched with respect to the nitride layer 14.

In either case, a buffer oxide layer 28a remains on the exposed sidewalls of the silicon fin 18 to protect the sidewalls 18A of the silicon fin 18 from the etching process. In addition, because the fin capping layer 16 is formed on an upper portion of the silicon fin 18, the silicon fin 18 is protected from etching damage during the etching process used in forming the dummy gates 30. As such, over-etching may be performed to ensure that neighboring dummy gates 30 are electrically separated without concern as to etching damage to the silicon fin 18.

Next, the exposed portions of the fin capping layer 16 are removed from the exposed portions of the silicon fin 18, and the exposed buffer oxide layer 28a (which remains on sidewalls of the silicon fin 18) is removed to expose sidewalls 18A of the silicon fin 18. At this time, as shown in FIG. 12A to FIG. 12D, after forming a spacer insulation layer, the spacer insulation layer is etched-back to form spacers 34 on the sidewalls of the dummy gates 30 and to simultaneously remove the fin capping layer 16. In other words, etching is performed to form the spacers 34, and the etching is continued (i.e. over-etching is performed) to remove the fin capping layer 16. The exposed buffer oxide layer 28a is also removed.

After forming the dummy gates 30, an optional oxidation process may be used to oxidize a part of the dummy gates 30 before forming the spacers 34. The width of the dummy gates 30 (corresponding to the length of a gate) may then be reduced by removing the oxidized portion. In this case, the oxidized portions of the dummy gates 30 may be removed by wet etching or chemical dry etching. Source/drain regions are then formed by implanting impurity ions into opposite ends of the exposed silicon fin 18.

Next, referring to FIG. 13A to FIG. 13D, an optional epitaxial process may be used to increase the width of the silicon fin to form an extended silicon fin 18AE. The source/drain regions may be formed in the extended silicon fin 18AE. Accordingly, because the size of the extended silicon fin is increased, margins may be increased in subsequent processes.

If an epitaxial silicon growth process is performed, impurity ion implantation for forming the source/drain regions may be performed after forming the extended silicon fin 18AE. In other words, the source/drain regions may be formed by implanting impurity ions into the extended silicon fin 18AE using the dummy gates 30 and the spacers 34 as an ion implantation mask. In some embodiments, it may be preferable to perform both the optional oxidation process and the optional epitaxial silicon growth.

Next, referring to FIG. 14A to FIG. 14D, an insulation layer 36 is formed to fill the space between the dummy gates 30 (thereby covering the exposed extended silicon fin 18AE). More particularly, an insulation layer is formed on the substrate surface over the dummy gates 30, filling the space between the dummy gates 30. The insulation layer may be formed using a conventional thin film deposition method. A planarizing process may then be performed until the etching mask 32 on top of each dummy gate 30 is exposed.

Next, referring to FIG. 15A to FIG. 15D, after removing the etching mask 32, the dummy gates 30 are removed. Accordingly, portions of the remaining buffer oxide liner 28b under the dummy gates 30 are exposed. The etching mask 32 may be removed by wet etching using phosphoric acid. Channel ion implantation may then be performed. In the channel ion implantation process, impurity ions may be implanted into the silicon fin through the exposed remaining buffer oxide liner 28b to create a channel region.

Then, referring to FIG. 16A to FIG. 16D, the exposed remaining buffer oxide liner 28b is removed. As a result, a residual fin capping layer 16a and sidewalls 18AC of the silicon fin 18 (which will form the channel) are exposed, and trenches or "grooves" 37 for defining gate electrodes are formed.

Next, a conductive material is formed to fill the grooves 37, so that transistor gate electrodes 38 are formed. More particularly, after forming the conductive material on the substrate surface over the insulation layer 36 to fill the grooves 37, a planarizing process is performed until the insulation layer 36 is exposed, leaving the conductive material in the grooves 37 to form the gates 38.

In this case, as shown in FIG. 17A to FIG. 17D, a gate capping layer 40 may be formed on an upper portion of the gates 38. More particularly, after the planarizing process leaves the conductive material in the groove 37, a portion of the conductive material in the groove 37 is removed to recess the conductive material relative to an upper portion of the insulation layer 36. As a result, a recessed gate 38 is formed. Accordingly, a groove 39 for the gate capping layer 40 is defined on an upper portion of the recessed gate line 38. A gate capping material, such as a nitride layer, is formed on the insulation layer 36 to fill the groove 39. The excess gate capping material is then removed by a planarizing process until the insulation layer 36 is exposed. The gate capping material that remains in the groove 39 forms the gate capping layer 40. The gate capping layer 40 may be formed in cases where a self-aligned contact process may be subsequently applied.

According to various embodiments of the present invention, because the gate is formed using a dummy gate, damages to the silicon fin may be reduced. Therefore, more reliable devices may be formed.

In addition, when epitaxial silicon growth is used, process margins may be improved for source/drain contact formation. Also, when an oxidation process is applied to the sacrificial dummy gate, the length of the gate may be reduced.

Further, because a buffer oxide layer is formed on the silicon fin, the sidewalls of the silicon fin may be protected from etching damage during the formation of the dummy gates.

Moreover, because the device isolation layer may include both upper and lower insulation layers, a narrow and deep trench may be completely filled.

Many alterations and modifications may be made by those having ordinary skill in the art, given the benefit of present disclosure, without departing from the spirit and scope of the invention. Therefore, it must be understood that the illustrated embodiments have been set forth only for the purposes of example, and that it should not be taken as limiting the invention as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

What is claimed is:

1. A method of forming a fin field effect transistor on a semiconductor substrate, comprising:
    forming a vertical fin protruding from the substrate;
    forming a buffer oxide liner on a top surface and on sidewalls of the fin;
    forming a dummy gate on at least a portion of the fin;
    forming an insulation layer on the fin surrounding the dummy gate;
    removing the dummy gate to expose the at least a portion of the fin and to form a trench surrounded by the insulation layer;

removing the buffer oxide liner from the exposed portion of the fin; and forming a gate in the trench.

2. The method of claim 1, further comprising forming a fin-capping layer on the top surface of the fin before forming the buffer oxide liner.

3. The method of claim 2, wherein the fin-capping layer comprises a nitride layer and an oxide layer.

4. The method of claim 1, further comprising forming a device isolation layer prior to forming the buffer oxide liner, wherein forming the device isolation layer comprises:
forming a nitride liner on the substrate and on the top surface and on the sidewalls of the fin;
forming an upper trench insulation layer on the substrate, wherein at least a portion of the fin protrudes above the upper trench insulation layer; and
removing the nitride liner from the at least a portion of the fin.

5. The method of claim 4, wherein forming the device isolation layer further comprises:
forming a lower trench insulation layer on the substrate before forming the nitride liner; and
removing the upper trench insulation layer after removing the nitride liner from the at least a portion of the fin.

6. The method of claim 4, wherein forming the device isolation layer further comprises:
forming an oxide liner on the fin before forming the nitride liner; and
removing the oxide liner from the at least a portion of the fin after removing the nitride liner.

7. The method of claim 2, wherein forming the insulation layer comprises:
removing the buffer oxide liner and the fin-capping layer from portions of the fin which are not covered by the dummy gate to expose other portions of the fin; and
forming an insulation layer surrounding the dummy gates on the exposed other portions of the fin.

8. The method claim 7, further comprising epitaxially growing silicon on the exposed portions of the fin before forming the insulation layer.

9. The method of claim 2, wherein forming the dummy gate comprises:
forming a sacrificial layer on the substrate; and
selectively etching the sacrificial layer with respect to the buffer oxide liner and the fin capping layer to form the dummy gate.

10. The method of claim 2, wherein forming the dummy gate comprises:
forming a sacrificial layer on the substrate; and
selectively etching the sacrificial layer and the buffer oxide liner with respect to the fin capping layer to form the dummy gate.

11. The method of claim 1, wherein forming the dummy gate further comprises:
oxidizing a portion of the dummy gate; and
removing the oxidized portion of the dummy gate to reduce a width of the dummy gate.

12. The method of claim 1, further comprising forming spacers on sidewalls of the dummy gate before forming the insulation layer.

13. The method of claim 1, further comprising forming a gate capping layer on the gate.

14. The method of claim 1, further comprising:
forming source and drain regions in opposite ends of the fin before forming the insulation layer; and
performing channel ion implantation in the exposed portion of the fin before forming the gate.

15. The method of claim 7, further comprising:
forming source and drain regions in opposite ends of the fin after removing the buffer oxide liner and before forming the insulation layer; and
performing channel ion implantation in the exposed portion of the fin after removing the buffer oxide liner and before forming the gate.

16. A method for fabricating a Fin FET comprising:
providing a substrate including silicon fins, wherein an upper surface of the silicon fins are protected by a fin capping layer formed thereon;
filling a part of a trench between the silicon fins with an insulation material to form a device isolation layer;
forming a sacrificial layer filling the trench and having a predetermined height from an upper portion of the fin capping layer;
patterning the sacrificial layer and the fin capping layer to form sacrificial dummy gate lines on sidewalls of silicon fins, the fin capping layer and the device isolation layer;
forming an insulation layer filling spaces between the sacrificial dummy gate lines;
removing the sacrificial dummy gate lines to form grooves defining gate lines in the insulation layer; and
filling the grooves with a conductive material to form gate lines.

17. The method for fabricating the Fin FET of claim 16, further comprising, after forming the sacrificial dummy gate lines, forming an epitaxial silicon layer on surface of silicon fins exposed by the spaces between the sacrificial dummy gate lines.

18. The method for fabricating the Fin FET of claim 16, further comprising: oxidizing a part of the sacrificial dummy gate lines by performing an oxidation process; and
removing a part of the oxidized sacrificial dummy gate lines after forming the sacrificial dummy gate line,
wherein the sacrificial layer is formed of silicon and the fin capping layer is formed of an oxide layer and a silicon nitride layer stacked in this order.

19. The method for fabricating the Fin FET of claims 16, wherein forming the sacrificial dummy gate lines on sidewalls of silicon fins, the fin capping layer and the device isolation layer by patterning the sacrificial layer and the fin capping layer comprises:
forming an etching mask on the sacrificial layer; and
etching the sacrificial layer exposed by the etching mask and the fin capping layer under the exposed sacrificial layer,
wherein the etching mask is removed before removing the sacrificial dummy gate lines.

20. The method for fabricating a Fin FET of claim 16, wherein forming a gate line by filling the grooves with a conductive material comprises:
forming the conductive material on the insulation layer to fill the groove; and
performing a planarizing process such that the conductive material remains in the grooves.

21. The method for fabricating the Fin FET of claim 20, further comprising:
defining grooves for a gate capping by etching-back a part of the gate lines after performing a planarizing process; and
filling the grooves for the gate capping with a gate capping layer.

22. The method for fabricating the Fin FET of claim 21, further comprising, after forming the sacrificial dummy gate lines, forming an epitaxial layer on a surface of the silicon fins exposed by the spaces between the sacrificial dummy gate lines.

23. The method for fabricating the Fin FET of claim 21, further comprising: oxidizing a part of the sacrificial dummy gate lines by performing an oxidation process; and
removing a part of the oxidized sacrificial dummy gate lines after forming the sacrificial dummy gate line,
wherein the sacrificial layer is formed of silicon, and the fin capping layer is formed of an oxide layer and a nitride layer, which are stacked sequentially.

24. The method for fabricating the Fin FET of claim 16, wherein forming a device isolation layer by filling a part of the trench between the silicon fins comprises:
forming a nitride liner on a bottom surface of the trench, on sidewalls of the silicon fin and on the fin capping layer;
forming an upper trench filling insulation layer on the nitride liner to fill the trench;
removing a part of the upper trench filling insulation layer to fill a part of the trench and to expose a part of the nitride liner; and
removing the exposed nitride liner to expose a part of the sidewalls of each silicon fin,
wherein the device isolation layer is comprised of a residual nitride liner and the upper trench filling insulation layer.

25. The method for fabricating the Fin FET of claim 16, wherein forming the device isolation layer by filling a part of trench with the insulation material between silicon fins comprises:
forming a lower trench insulation layer to fill the trench;
removing a part of the lower trench insulation layer to expose a part of sidewalls of silicon fins;
forming a nitride liner;
forming an upper trench insulation layer to fill the trench;
removing a part of the upper trench insulation layer to fill a part of trench and to expose a part of the nitride liner; and
removing the exposed nitride liner to expose a part of the sidewalls of the silicon fins,
wherein the device isolation layer is comprised of the lower trench insulation layer, the nitride liner and the upper trench insulation layer.

26. The method for fabricating the Fin FET of claim 25, further comprising, after removing the exposed nitride liner, removing the upper trench insulation layer.

27. The method for fabricating the Fin FET of claim 25, further comprising forming a buffer oxide liner after exposing a part of the sidewalls of the silicon fins by removing the exposed nitride liner, and wherein forming a sacrificial dummy gate line comprises:
forming an etching mask on the sacrificial layer; and
etching the sacrificial layer, the buffer oxide layer and the fin capping layer exposed by the etching mask,
wherein a residual buffer oxide liner exposed after removing sacrificial dummy gate lines is removed.

28. The method for fabricating the Fin FET of claim 27, further comprising:
forming a protection oxide liner before forming the nitride liner; and
removing an exposed part of the protection oxide liner after removing the exposed nitride liner.

29. The method for fabricating the Fin FET of claim 27, further comprising:

forming an epitaxial silicon layer on a surface of silicon fins exposed by the spaces between the sacrificial dummy gate lines after forming the sacrificial dummy gate line.

30. The method for fabricating the Fin FET of claim 27, further comprising, after forming the sacrificial dummy gate lines:
oxidizing a part of the dummy gate lines by performing an oxidation process; and
removing a part of an oxidized sacrificial dummy gate lines after forming the sacrificial dummy gate lines,
wherein the sacrificial layer is formed of silicon, and the fin capping layer is formed of an oxide layer and a nitride layer, which are stacked sequentially.

31. The method for fabricating the Fin FET of claim 27, wherein etching the sacrificial layer, the buffer oxide liner and the fin capping layer exposed by etching mask comprises:
selectively etching the sacrificial layer exposed by the etching mask with respect to the buffer oxide liner and the fin capping layer;
removing an exposed part of the fin capping layer; and
removing an exposed part of the buffer oxide liner to expose a part of the silicon fins,
wherein the sacrificial dummy gate lines are removed after removing the etching mask.

32. The method for fabricating the Fin FET of claim 27, wherein etching the sacrificial layer, the buffer oxide layer and the fin capping layer exposed by etching mask comprises:
etching the sacrificial layer exposed by the etching mask and the buffer oxide layer;
removing an exposed part of the fin capping layer; and
removing an exposed part of the buffer oxide liner to expose a part of the silicon fins,
wherein the sacrificial dummy gate lines are removed after removing the etching mask.

33. A method for fabricating a Fin FET comprising:
forming a fin capping layer on a substrate;
etching the substrate exposed by the fin capping layer to form silicon fins;
filling a part of a trench between the silicon fins with an insulation layer to form a device isolation layer;
forming a buffer oxide liner;
forming a sacrificial layer filling the trench and having a predetermined height from an upper portion of the fin mask;
forming an etching mask on the sacrificial layer;
etching the sacrificial layer exposed by the etching mask, the buffer oxide layer and the fin capping layer to form sacrificial dummy gate lines and expose a part of the silicon fins;
filling a space between the sacrificial dummy gate lines with an insulation layer;
removing the etching mask and sacrificial dummy gate lines to form grooves defining gate lines;
removing a part of the buffer oxide liner exposed by the grooves; and
filling the grooves with a conductive material to form gate lines.

34. The method for fabricating the Fin FET of claim 33, wherein forming the sacrificial dummy gate lines and exposing a part of sidewalls of silicon fins by etching the sacrificial layer exposed by the etching mask, the buffer oxide layer and the fin capping layer comprises:
etching the sacrificial layer exposed by the etching mask to form the sacrificial dummy gate lines;

etching a part of the buffer oxide liner exposed by the sacrificial dummy gate lines to expose the fin capping layer;

forming a spacer insulation layer on sidewalls of the sacrificial dummy gate lines;

etching-back the spacer insulation layer to form a spacer on sidewalls of the sacrificial dummy gate lines and, at the same time, removing the fin capping layer; and removing a residual buffer oxide liner.

35. The method for fabricating the Fin FET of claim 27, further comprising:

oxidizing a part of the dummy gate lines by performing an oxidation process; and removing a part of the oxidized sacrificial dummy gate lines before forming the spacers and after forming the sacrificial dummy gate line, wherein the sacrificial layer is formed of silicon, and the fin capping layer is formed of an oxide layer and a nitride layer, which are stacked sequentially.

36. The method for fabricating the Fin FET of claim 34, further comprising forming an epitaxial layer on the exposed part of the silicon fins.

37. The method for fabricating the Fin FET of claim 35, further comprising forming an epitaxial layer on an exposed part of the silicon fins.

38. The method for fabricating the Fin FET of claim 35, further comprising:

performing an ion implantation process for forming source/drain regions after removing the residual buffer oxide liner and before forming the insulation layer; and performing a channel ion implantation process after removing the buffer oxide liner exposed by the grooves.

39. The method for fabricating the Fin FET of claim 36, further comprising:

performing an ion implantation process for forming source/drain regions after removing the residual buffer oxide liner and before forming the insulation layer; and performing a channel ion implantation process after forming the epitaxial silicon layer.

40. The method for fabricating the Fin FET of claim 38, wherein forming gate lines by filling the grooves with a conductive material comprises:

forming the conductive material on the insulation layer to fill the grooves; and performing a planarizing process such that the conductive material remains in the grooves.

41. The method for fabricating the Fin FET of claim 39, further comprising:

etching-back a part of the gate lines to define grooves for a gate capping layer; and filling the grooves with a gate capping layer.

42. The method for fabricating the Fin FET of claim 38, wherein forming a device isolation layer by filling a part of the trench between silicon fins comprises:

forming a lower trench insulation layer to fill the trench;

removing a part of the lower trench insulation layer to expose a part of the sidewalls of the silicon fins;

forming a nitride liner;

forming an upper trench insulation layer to fill the trench;

removing a part of the upper trench insulation layer to fill a part of the trench; and removing an exposed nitride liner to expose a part of the sidewalls of each silicon fin, wherein the device isolation layer is comprised of the lower trench insulation layer, the nitride liner and the upper trench insulation layer.

43. The method for fabricating the Fin FET of claim 41, further comprising:

forming a protection oxide liner before forming the nitride liner; and removing an exposed protection oxide liner after removing the exposed nitride liner.

* * * * *